United States Patent [19]
Morita

[11] Patent Number: 5,237,199
[45] Date of Patent: * Aug. 17, 1993

[54] SEMICONDUCTOR DEVICE WITH INTERLAYER INSULATING FILM COVERING THE CHIP SCRIBE LINES

[75] Inventor: Naoyuki Morita, Nagano, Japan

[73] Assignee: Seiko Epson Corporation, Tokyo, Japan

[*] Notice: The portion of the term of this patent subsequent to Aug. 4, 2009 has been disclaimed.

[21] Appl. No.: 850,826

[22] Filed: Mar. 13, 1992

Related U.S. Application Data

[62] Division of Ser. No. 508,848, Apr. 12, 1990, Pat. No. 5,136,354.

[30] Foreign Application Priority Data

| Apr. 13, 1989 [JP] | Japan | 1-94124 |
| May 18, 1989 [JP] | Japan | 1-124741 |
| Jan. 8, 1990 [JP] | Japan | 2-432 |

[51] Int. Cl.$^5$ .............. H01L 27/10; H01L 27/02; H01L 27/12; H01L 29/34
[52] U.S. Cl. .................. 257/638; 257/758; 257/797; 257/503
[58] Field of Search .......... 357/40, 47, 49, 54; 257/503, 638, 758, 797

Primary Examiner—Rolf Hille
Assistant Examiner—Mahshid Saadat
Attorney, Agent, or Firm—Spensley Horn Jubas & Lubitz

[57] ABSTRACT

A semiconductor device wafer in which the interlayer insulating film between wirings and the passivation film formed during the manufacturing process are left on the entire surface of the scribe line area during dicing. The interlayer insulating film between wirings and the passivation film formed during the manufacturing process may be left on most of the scribe line area, in which case a slit groove is provided along the periphery of a chip and the passivation film is removed at the location of the slit groove. Alternatively, the passivation film formed during the manufacturing process may be left on a part of the scribe line area where a film structure is provided. In this case, a slit groove is provided along the periphery of a chip and the passivation film is removed at the location of the slit groove in the same way as mentioned above on the part of the scribe line in which there is a film structure such as an alignment mark, while most of the passivation film on the scribe lines is removed in the area in which there is no film structure.

7 Claims, 4 Drawing Sheets

SEMICONDUCTOR DEVICE WITH INTERLAYER INSULATING FILM COVERING THE CHIP SCRIBE LINES

This is a division of application Ser. No. 07/508,848, filed on Apr. 12, 1990, U.S. Pat. No. 5,136,354.

BACKGROUND OF THE INVENTION

1. Field of the Invention

The present invention relates to a semiconductor device wafer and, more particularly, to the wafer regions constituting scribe lines.

2. Description of the Prior Art

In the art of fabricating semiconductor devices, when the interlayer insulating films formed between wiring regions on a semiconductor substrate by CVD are subjected to a predetermined processing involving a fine processing technique, all the interlayer films on the scribe lines are removed. Similarly, when wiring films formed by sputtering are processed, all the wiring films on the scribe lines are removed. As a result, when the structure of the device has been completed, the semiconductor substrate is generally exposed along the scribe lines to remove all the films which were sequentially formed in the process of fabricating the semiconductor device.

For example, FIG. 2 is a schematic sectional view of the structure of a chip and a scribe line in a conventional MOS-type semiconductor device having one layer of gate wiring and two layers of metal wiring.

In FIG. 2, the reference numeral 1 represents a semiconductor substrate, 2 a scribe line, 3 a part of a chip and 4 a LOCOS film constituting a device isolation region. The chip 3, namely a semiconductor device, is composed of a source and a drain 5 formed in the semiconductor substrate 1, a gate insulating film 6 formed on the semiconductor substrate 1 and a gate electrode layer 7 formed thereon. As is clear from FIG. 2, the scribe line area is in the form of a deep groove with the surface of the semiconductor substrate 1 exposed along the scribe line 2 and with the gate electrode layer 7, interlayer insulating films 8, 10 and metal wiring 9, 11 removed. This is because in fabricating a general semiconductor device, the surface of the semiconductor substrate 1 is constantly exposed on the scribe line while the interlayer insulating films and the metal wirings are formed on the semiconductor substrate 1 in the chip area. The difference in height between the surface of the semiconductor chip 3 and the surface of the scribe line 2 increases as the fabricating steps proceed. The interlayer insulating film 8 is formed between the gate electrode wiring 7 and the first metal wiring 9, and interlayer insulating film 10 is formed between the first metal wiring 9 and the second metal wiring 11.

The reference numeral 17 identifies one of the contact holes for bringing the source and drain 5 and the first metal wiring 9 into contact with each other. The reference 18 is a contact hole for bringing the first metal wiring 9 and the second metal wiring 11 into contact with each other. The reference numeral 19 denotes a bonding pad.

As described above, in order to prevent various mechanical strains, due to machining for scribing, or dicing, the semiconductor device to produce chips, from exerting a deleterious influence in the chips, the semiconductor substrate 1 is exposed on the scribe line 2 such that the scribe line area is formed as a deep groove.

A drawback of the above-described conventional semiconductor device, however, is that formation of the scribe line requires a complicated process. That is, the steps of removing the film which was laminated on the scribe line simultaneously with the formation of the wiring film, the interlayer insulating film, a passivation film, and the like are required every time each film is formed on the semiconductor substrate in the chip areas.

The concrete problem in the manufacturing process will be explained in the following with reference to the accompanying drawings.

FIG. 3 is a sectional view of a semiconductor device during a fine processing step. After a metal wiring film 14 is formed on the interlayer insulating film 10 by sputtering, a resist film 13 is applied to the metal wiring film 14 so as to form the metal wiring 11. As is obvious from FIG. 3, the thickness of the resist film 13 on the chip 3 is different from the thickness of the resist film 13 on the scribe line 2; the resist film on the scribe line 2 is relatively thick. This is because when a resist is applied to an uneven surface of a semiconductor wafer by spin coating, the resist film generally becomes thin at protruding portions and thick at recessed portions in comparison with the case of applying a resist to a flat wafer surface. In the structure of a conventional semiconductor device in which all the films on the scribe line 2 are removed, since the groove along the scribe line 2 is deeper than recessed portions in the chip 3, the thickness of the resist film becomes especially large on the scribe line 2.

For the purpose of patterning the resist film, the resist film is appropriately exposed by an exposing apparatus so as to form a predetermined resist pattern. It is generally known that the exposure necessary for obtaining a predetermined resist pattern increases with the thickness of the resist film. There are two kinds of resists, namely, a positive type resist and a negative type resist. A positive type resist is generally used for fine processing. The following explanation relates to a positive type resist. Since the thickness of the resist film becomes especially large on the scribe line 2, an exposure appropriate for the chip 3 is insufficient for the scribe line 2, thereby leaving some part of the resist film unexposed.

FIG. 4 is a sectional view of the semiconductor device shown in FIG. 3 after resist film 13 is patterned. As is clear from FIG. 4, unexposed resist film areas 15 remain on the side walls of the groove on the scribe line 2. The metal wiring 11 is next formed while using the resist pattern 13 as a mask. The unexposed resist film 15 also works as a mask, and a narrow partial metal wiring film 16 remains on the side wall of the groove on the scribe line 2, as shown in FIG. 5, after the unexposed resist film is removed. The narrow partial metal wiring film 16 easily slips off during an after-treatment step such as the step of removing the resist pattern after the etching of the metal wiring film 14, and parts of the separated metal wiring film 16 can then adhere onto the surface of a chip 3, thereby disadvantageously lowering chip yield and quality. This occurs because the narrow partial metal wiring film 16 tends to behave like fine dust.

Various marks necessary at the time of fabrication, such as an alignment mark for an exposing apparatus, are generally placed on the scribe line. FIG. 6 is a sectional view of a semiconductor device in the state after the steps for forming an alignment mark 20 for an exposing apparatus from the metal wiring film 11 and removing a passivation film from the bonding pad 19. As is obvious from FIG. 6, an undercut etching is performed on the interlayer insulating film 10 right under alignment mark 20. This is produced because the scribe line area 2 is simultaneously etched when the passivation film 12 is etched. The alignment mark 20 with the undercut etching produced in this way easily slips off of film 10, during etching or in an after-treatment step after etching, thereby producing a problem similar to that above with reference to film 16 in FIG. 5.

SUMMARY OF THE INVENTION

Accordingly, it is an object of the present invention to eliminate the above-described problems in the prior art and to provide a semiconductor device which allows easy dicing by scribing at the step of forming chips and which has a stable yield, a high resistance to moisture and a high quality at a low cost.

To achieve this aim, in a first aspect of the present invention, there is provided a semiconductor device in which the interlayer insulating film between wirings and the passivation film formed during the manufacturing process are left on the entire surface of the scribe line area.

In a second aspect of the present invention, there is provided a semiconductor device in which the interlayer insulating film between wirings and the passivation film formed during the manufacturing process are left on most of the scribe line area, a slit groove is provided in tho vicinity of the end line of the passivation film along the periphery of each chip and the passivation film at the portion corresponding to the slit groove is removed.

In a third aspect of the present invention, there is provided a semiconductor device in which the interlayer insulating film between the wirings and the passivation film formed during the manufacturing process are left on a part of the scribe line area, a slit groove is provided in the vicinity of the end line of the passivation film along the periphery of each chip and the passivation film at the portion corresponding to the slit groove is removed in the same way as in the second aspect of the present invention in the area on the scribe line in which there is a pattern, such as an alignment mark, while most of the passivation film on the scribe line is removed in the area in which there is no pattern such as an alignment mark.

The scribe line structure of the semiconductor devices according to the first, second and third aspects of the present invention is preferably selected depending upon the size, kind and purpose of the semiconductor device to be produced.

In a semiconductor device according to the first aspect of tho present invention, since all the interlayer insulation films are applied on the scribe line, the difference in level between the scribe line area and the chip area is minimized, so that unexposed resist film, which is conventionally left due to the large thickness of the resist film on the scribe line, is not produced.

In a semiconductor device according to the second aspect of the present invention, since the scribe line area is isolated from the chip area by the slit groove, no cracking is produced in the passivation film at the chip edge during dicing.

In a semiconductor device according to the third aspect of the present invention, since the passivation film on the scribe line area only remains at a part where there is a pattern, the mechanical load during dicing is reduced, thereby facilitating dicing.

The above and other objects, features and advantages of the present invention will become clear from the following description of the preferred embodiments thereof, taken in conjunction with the accompanying drawings.

DESCRIPTION OF THE PREFERRED EMBODIMENTS

First Embodiment

Figure 1:
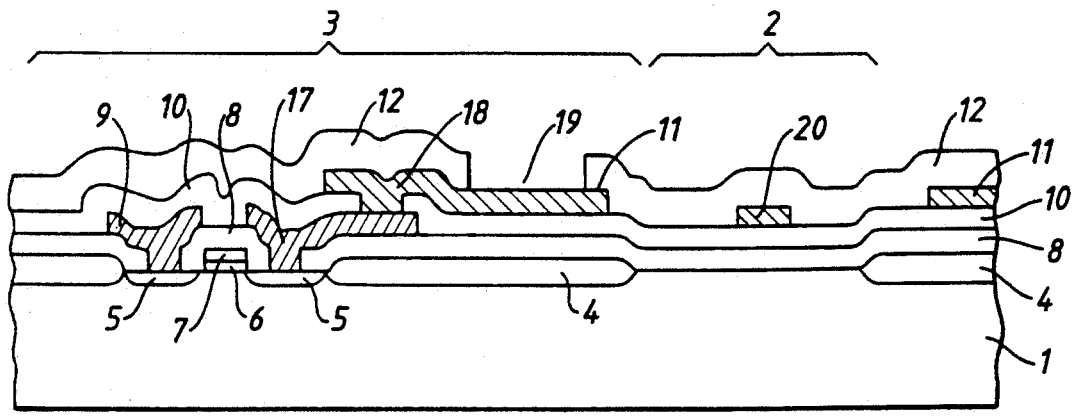
FIG. 1 is a cross-sectional view of the structure of a first embodiment of a semiconductor device according to the present invention.
Figure 2:
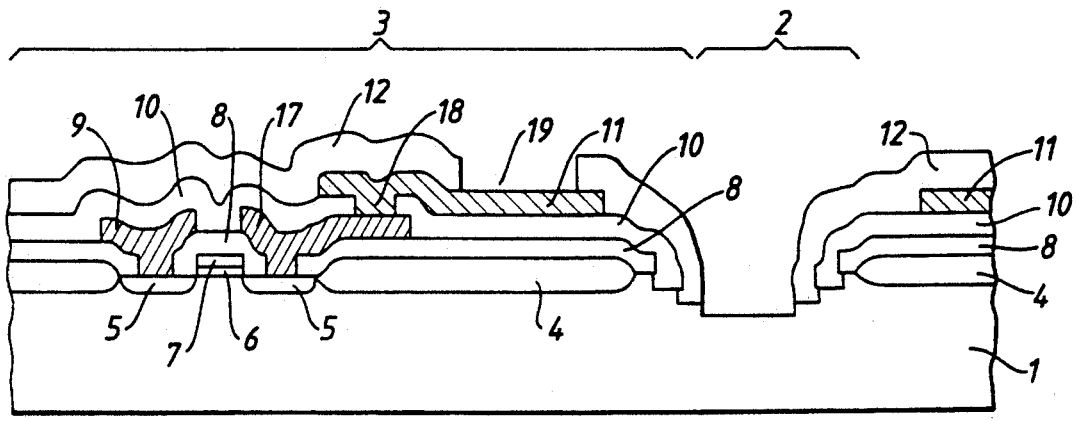
FIG. 2 is a cross-sectional view of a chip and a scribe line area of a conventional semiconductor device.
Figure 3:
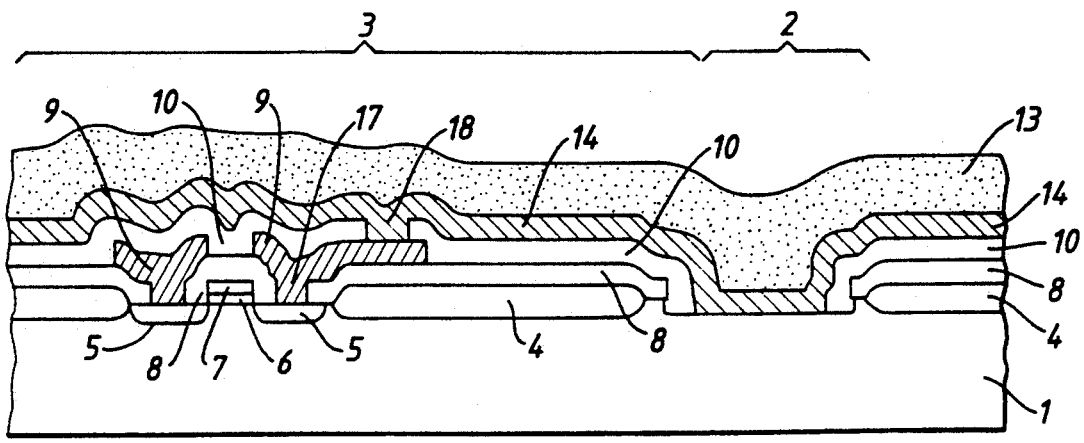
FIGS. 3, 4, 5 and 6 are cross-sectional views of the processing steps of a conventional semiconductor device.
Figure 4:
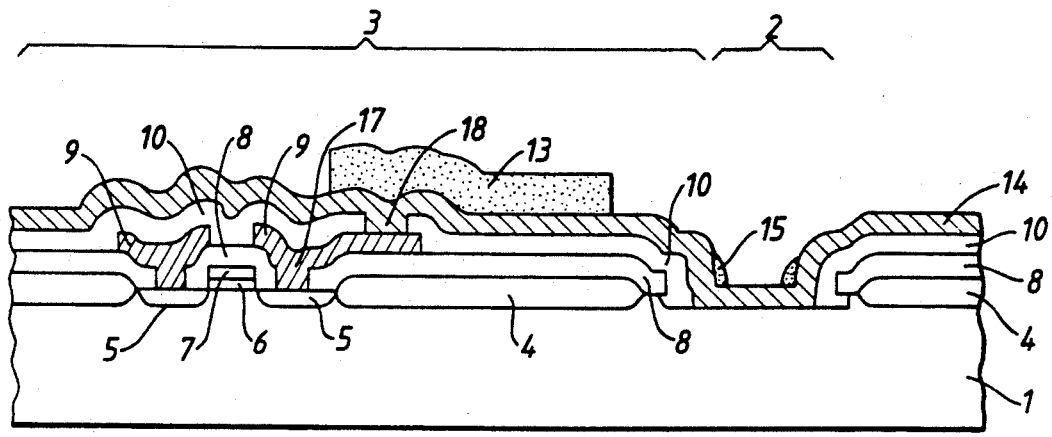
Figure 5:
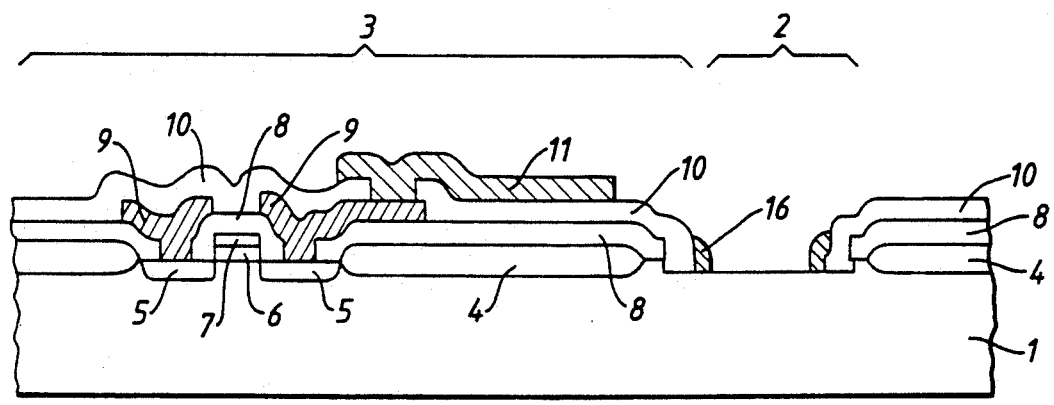

FIG. 1 is a pictorial cross-sectional view of the structure of a first embodiment of a semiconductor device according to the present invention, in which a semiconductor IC wafer will be divided into chips in the same way as in the conventional semiconductor device shown in FIG. 2. In FIG. 1, the reference numerals 1 to 14 and 17 to 19 denote the same or like elements as those shown in FIG. 2, and a detailed description thereof will be omitted.

In FIG. 1, when the contact holes 17 are formed so as to bring the source and drain 5 and the first metal wiring 9 into contact with each other, by using a fine processing technique after the interlayer insulating film 8 is formed by CVD or the like, the interlayer insulating film 8 is left on the entire surface of the scribe line 2 by the provision of a resist pattern which prevents the interlayer insulating film 8 on scribe line 2 from being etched during etching of holes 17. Similarly, the subsequently applied interlayer insulating film 10 is left on the entire surface of the scribe line 2. As is clear from FIG. 1, by leaving the interlayer insulating films 8 and 10 on the entire surface of the scribe line 2, there is almost no difference in level between the chip area 3 and the scribe line area 2. Consequently, there is almost no difference in the thickness of a resist film (not shown in FIG. 1) between chip area 3 and scribe line area 2. Thus, it is possible to completely eliminate the problem of unexposed resist film which is caused by a thick resist film on the scribe line 2 in the conventional semiconductor device wafer shown in FIGS. 2-5.

Figure 6:
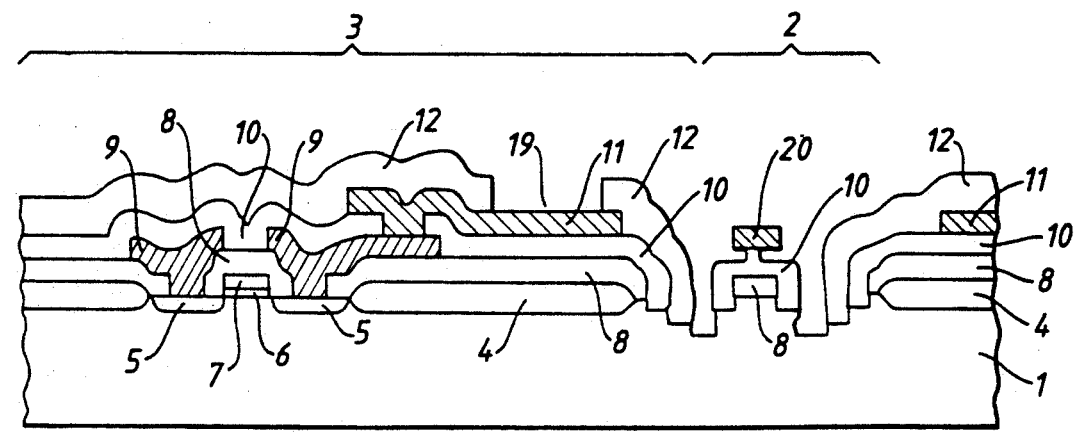

In addition, since the passivation film 12 is also left on the entire surface of the scribe line 2, alignment marks 20 for the exposing apparatus are thoroughly protected during the step of etching the passivation film, thereby completely eliminating the problem of slip-off of the alignment mark, as explained with reference to FIG. 6.

The dicing step is carried out by a blade or the like (not shown) along the center of each scribe line 2. The scribe line areas having no alignment marks have the structure shown in FIG. 7, and the dicing step is carried out simultaneously without the need for the steps of removing the interlayer insulating films 8 and 10 and the passivation film 12 on the scribe lines 2. Thus, chips are separated and formed at a low cost.

Second Embodiment

Figure 8:
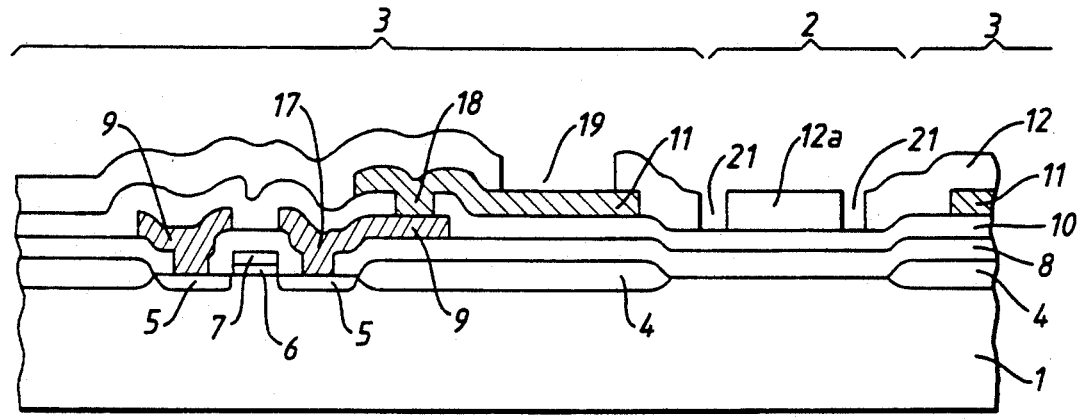
FIG. 8 is a cross-sectional view of a second embodiment of a semiconductor device according to the present invention.

FIG. 8 is a schematic sectional view of the structure of a second embodiment of a semiconductor device according to the present invention, in which a semiconductor element is formed into chips in the same way as in the first embodiment shown in FIG. 1. In FIG. 8, the reference numerals 1 to 14 and 17 to 19 denote the same or like elements as those shown in FIG. 1, and explanation thereof will be omitted.

When the contact holes 17 are formed so as to bring the source and drain 5 and the first metal wiring 9 into contact with each other, by using a fine processing technique after the interlayer insulating film 8 is formed by CVD or the like, the interlayer insulating film 8 is left on the entire surface of the scribe lines 2 by the provision of a suitable resist pattern (not shown) so as to prevent the interlayer insulating film 8 on lines 2 from being etched during etching of holes 17. Similarly, the interlayer insulating film 10 is left on the entire surface of scribe lines 2. When the bonding pad 19 is formed, the passivation film 12 on lines 2 is protected by a resist film (not shown) except for a slit region along the periphery of each chip. The slit regions are etched so as to form slit grooves 21. Etching of slit grooves 21 down to the upper surface of interlayer insulating film 10 serves to remove the passivation film 12 at the locations corresponding to the slit grooves 21. However, according to this embodiment, slit grooves 21 may or may not extend completely to interlayer insulating film 10. Namely, slit grooves 21 need only be deep enough so that after dicing chips 3 exhibit good humidity resistance, for reasons to be explained below. This feature is the same as in the embodiment 3, which will be described below. Consequently, a passivation film region 12a remains substantially only at the central portion of each scribe line 2 in the state of being effectively separated from the remaining passivation film 12. Dicing is carried out along the passivation film region 12a, as indicated by the arrow 22 in FIG. 9. Here, the slit grooves 21 desirably exist along both edges of the scribe line area. Depending on circumstances, even one slit grooves 21 has a good effect to improve the humidity resistance of the separated chips.

Figure 9:
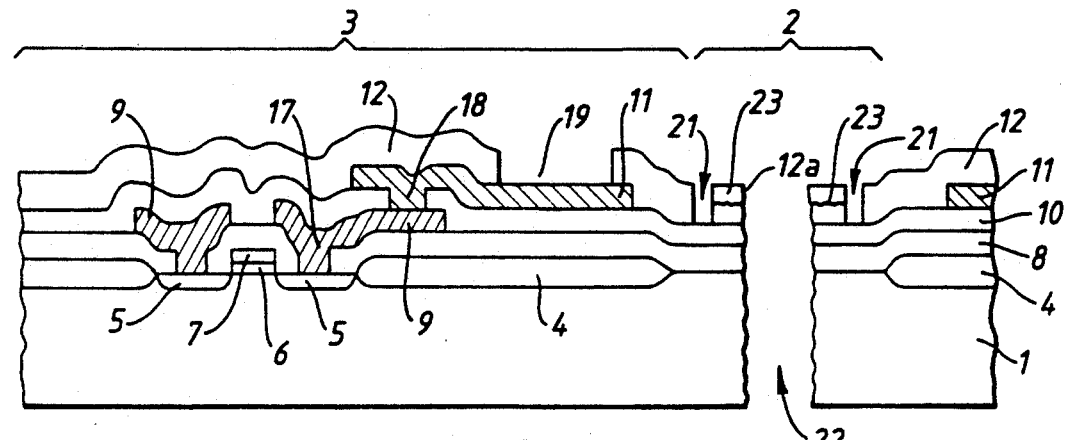
FIG. 9 is a cross-sectional view of the embodiment shown in FIG. 8 in the state in which a dicing step has been completed.

The second embodiment shown in FIG. 8 in the state in which dicing has been completed is shown in FIG. 9. Since a crack 23 normally produced during dicing is stopped by slit grooves 21, the crack 23 does not propagate beyond passivation film region 12a, thereby preventing the production of a crack in the passivation film 12. Thus, since such a crack would provide a moisture penetration path into a chip, chips 3 having a high resistance to moisture are obtained.

Figure 7:
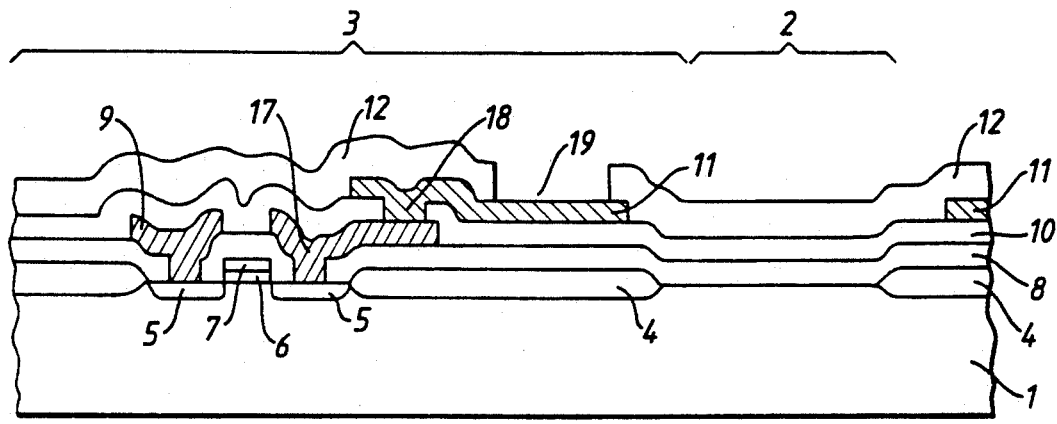
FIG. 7 is a cross-sectional view of a portion of the semiconductor device shown in FIG. 1 where no pattern is present on the scribe line.
Figure 10:
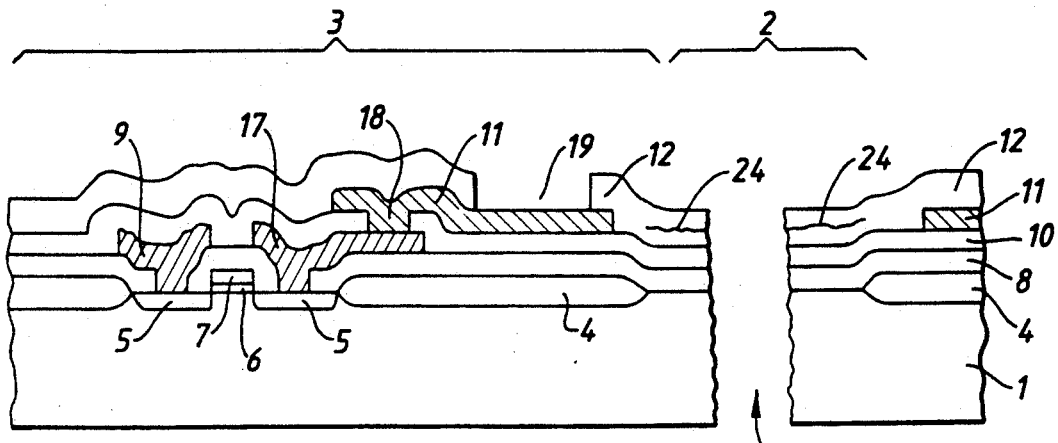
FIG. 10 is a cross-sectional view of the embodiment shown in FIGS. 1 and 7 in the state in which a dicing step has been completed.

This advantage of the second embodiment is not obtained when chips are diced along the scribe line 2 of the first embodiment (see FIG. 7). In the case in which the chips 3 are connected by the interlayer insulating films 8 and 10 and the passivation film 12 on the scribe line 2, as shown in FIG. 7, when dicing is carried out in the direction indicated by the arrow 22 of FIG. 10, a crack 24 is produced in the passivation film 12 at the edges of chips 3. If the crack 24 reaches the main part of a chip 3, it exerts a deleterious influence. From this point of view, the structure of the second embodiment shown in FIG. 8 can be said to have mainly achieved the improvement of not deteriorating resistance to moisture.

Third Embodiment

Figure 11:
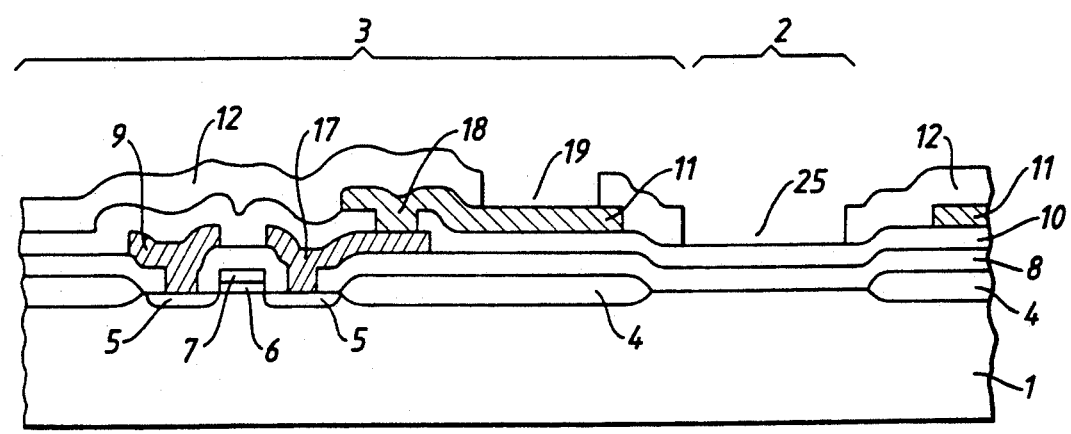
FIG. 11 is a cross-sectional view of a third embodiment of a semiconductor device according to the present invention.

FIG. 11 is a cross-sectional view of the structure of a third embodiment of a semiconductor device wafer according to the present invention, on which chips are fabricated in the same way as in the first embodiment shown in FIG. 1. In FIG. 11, the reference numerals 1 to 14 and 17 to 19 denote the same or like elements as those shown in FIG. 1, and explanation thereof will be omitted.

In FIG. 11, when contact holes 17 are formed so as to bring the source and drain 5 and the first metal wiring 9 into contact with each other, by using a fine processing technique after the interlayer insulating film 8 is formed by CVD or the like, the interlayer insulating film 8 is left on the entire surface of the scribe line 2 by the provision of a suitable resist pattern so as to prevent the interlayer insulating film 8 from being etched away from lines 2 during etching of holes 17. Similarly, the interlayer insulating film 10 is left on the entire surface of the scribe line 2. A part of the passivation film 12 on which no pattern such as an alignment mark (not shown) is formed is removed substantially completely during the step of forming bonding pad 19. As a result, since isolated passivation film regions having the form of passivation film region 12a of FIG. 8 remain on scribe lines 2 only at locations where there are alignment marks, interlayer insulating film 10 is exposed along a major part of each scribe line 2.

In this way, a comparatively wide slit 25 with the surface of the interlayer insulating film 10 exposed is formed at the central portion of each scribe line 2. In this case, a slit groove (not shown) such as that shown in the second embodiment is formed only at the locations where there is a pattern.

Since there is no passivation film region 12a shown in FIG. 8, when dicing is carried out along the slit 25 of the scribe line having the above-described structure, the load on the dicing blade (not shown) is reduced accordingly, so that the generation of cracks 24 on the passivation film 12 of the edges of chips 3 is prevented and the useful life of the blade is prolonged.

The semiconductor device wafer according to the first to third embodiments is an MOS-type semiconductor device with one layer of gate wiring and two layers of metal wiring. In these embodiments, the structure of the scribe lines is chiefly explained. The metal wiring may be replaced by a silicide wiring. That is, the present invention is applicable to any semiconductor device having at least one layer of wiring.

As described above, according to the present invention, since the interlayer insulating film and a part or most of the interlayer insulating film and the passivation film formed during the manufacturing process of a semiconductor device wafer are left on the scribe lines, the following advantages are produced. According to the first aspect of the present invention, it is possible to provide a semiconductor device wafer having a stable yield and a high quality without increasing the number of manufacturing steps. According to the second aspect of the present invention, it is possible to provide semiconductor device chips having a stable resistance to moisture and a high reliability without increasing the number of manufacturing steps. Further, according to the third aspect of the present invention, it is possible to provide semiconductor device chips having an excellent resistance to moisture and capable of prolonging the useful life of a dicing blade without increasing the number of manufacturing steps.

This application relates to subject matter disclosed in Japanese Patent Applications Nos. 94124/89, filed Apr. 13, 1989, 124741/89, filed May 18, 1989, and 432/90, filed Jan. 8, 1990, the disclosure of which is incorporated herein by reference.

While there has been described what are at present considered to be preferred embodiments of the invention, it will be understood that various modifications may be made thereto, and it is intended that the appended claims cover all such modifications as fall within the true spirit and scope of the invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An integrated circuit chip comprising a substrate having a surface bounded by lateral edges and having scribe lines constituted by regions of the substrate surface adjacent the lateral edges, wherein said chip has at least one semiconductor element composed of a plurality of patterned layers of electrically conductive material and at least one interlayer insulation film having portions which extend across said chip and interposed between two of said layers of electrically conductive material to form a component part of each said element, said interlayer insulation film further having portions which extend across the entirety of said scribe lines and which are contiguous with portions of said interlayer insulation film that extend across each said chip.

2. A chip as defined in claim 1 further comprising a passivation film covering said chips and the entirety of said scribe lines.

3. A chip as defined in claim 1 further comprising a passivation film covering said interlayer insulation film over at least portions of said chips and said scribe line regions, said passivation film having a groove formed along each scribe line and spaced from the associated lateral edge of the substrate.

4. A chip as defined in claim 1 wherein: each scribe line has a longitudinal edge which coincides with a respective lateral edge of the substrate surface, and further comprising: a film having a defined pattern located at at least one scribe line region above said interlayer insulation film and extending inwardly from the longitudinal edge of the scribe line edges; and a passivation film covering said chip and the at least one scribe line region, said passivation film having, at the at least one scribe line region, a groove formed along the scribe line and spaced from the associated edge of the substrate, and said passivation film being absent from scribe line regions where said film having a defined pattern is not present.

5. A chip as defined in claim 1 wherein said interlayer insulation film directly contacts said substrate regions constituting scribe lines.

6. A chip as defined in claim 5 wherein the surface of said substrate is initially planar and the substrate surface regions constituting said scribe lines constitute portions of the initially planar surface of said substrate.

7. A chip as defined in claim 1 wherein the surface of said substrate is initially planar and the substrate surface regions constituting said scribe lines constitute portions of the initially planar surface of said substrate.

* * * * *